United States Patent [19]
Chen et al.

[11] Patent Number: 5,774,394
[45] Date of Patent: Jun. 30, 1998

[54] MAGNETIC MEMORY CELL WITH INCREASED GMR RATIO

[75] Inventors: Eugene Chen, Gilbert; Saied N. Tehrani, Tempe; Steven A. Voight, Gilbert, all of Ariz.

[73] Assignee: Motorola, Inc., Schaumburg, Ill.

[21] Appl. No.: 862,090

[22] Filed: May 22, 1997

[51] Int. Cl.$^6$ .................................................. G11C 11/15
[52] U.S. Cl. ........................................ 365/158; 365/173
[58] Field of Search ..................................... 365/158, 173

[56] References Cited

U.S. PATENT DOCUMENTS

| | | | |
|---|---|---|---|
| 5,343,422 | 8/1994 | Kung et al. | 365/173 |
| 5,648,885 | 7/1997 | Nishioka et al. | 360/113 |
| 5,703,805 | 12/1997 | Tehrani et al. | 365/173 |
| 5,705,973 | 1/1998 | Yuan et al. | 338/32 R |

*Primary Examiner*—David C. Nelms
*Assistant Examiner*—Andrew Q. Tran
*Attorney, Agent, or Firm*—Eugene A. Parsons

[57] ABSTRACT

A first layer of non-magnetic material is positioned on a layer of an oxide of a magnetic material (e.g. NiO). First and second layers of magnetic material are stacked in parallel, overlying relationship and separated by a second layer of non-magnetic material sandwiched therebetween to form a magnetic memory cell. The magnetic memory cell is positioned on the first layer of nonmagnetic material so as to sandwich the first nonmagnetic layer between the oxide and the first magnetic layer of the cell. The first layer of non-magnetic material has a thickness (e.g. approximately 7 Å) which prevents the oxide from pinning the first layer of magnetic material and adapts the first layer of magnetic material to the layer of oxide so as to increase the GMR ratio of the magnetic memory cell.

17 Claims, 1 Drawing Sheet

5,774,394

MAGNETIC MEMORY CELL WITH INCREASED GMR RATIO

FIELD OF THE INVENTION

The present invention pertains to magnetic memory cells and more specifically to magnetic memory cells utilizing a giant magnetoresistive (GMR) ratio to sense the states.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials.

Another type of memory cell uses multi-layer giant magnetoresistive materials (GMR) and utilizes dimensions around one micron, in order to increase density. A conductive layer is again disposed between the multi-layers of magnetic material. In this structure the magnetization vectors are parallel to the length of the magnetic material instead of the width. In one embodiment the magnetization vector of one magnetic layer is always maintained in one direction while the magnetization vector of the second magnetic layer switches between parallel and antiparallel to the first vector in order to represent both logical "0" and "1" states. This structure is commonly referred to as a spin valve structure. In another embodiment the magnetization vectors of both magnetic layers are always maintained in the same direction, with opposite vector directions representing logical "0" and "1" states.

Still another type of memory cell uses multi-layer giant magnetoresistive materials (GMR) and also utilizes dimensions around one micron, in order to increase density. In this type of cell a non-conductive layer is disposed between the multi-layers of magnetic material. The magnetization vectors are again parallel to the length of the magnetic material instead of the width but sense current tunnels through the non-conducting layer from one layer of magnetic material to the other, rather than being conducted lengthwise. This structure is commonly referred to as a tunneling GMR cell.

A magnetic random access memory (MRAM) is a non-volatile memory which basically includes a GMR cell, a sense line, and a word line. The MRAM employs the GMR effect to store memory states. Magnetic vectors in one or all of the layers of GMR material are switched very quickly from one direction to an opposite direction when a magnetic field is applied to the GMR cell over a certain threshold. According to the direction of the magnetic vectors in the GMR cell, states are stored, and the GMR cell maintains these states even without a magnetic field being applied. The states stored in the GMR cell can be read by passing a sense current through the cell in a sense line and sensing the difference between the resistances (GMR ratio) when one or both of the magnetic vectors switch. The problem is that in most GMR cells the GMR ratio is relatively low (e.g. 10% or less) and, consequently, reading or sensing the state stored in the GMR cell can be relatively difficult. Some attempts have been made to increase the GMR ratio but most of these attempts result in an increase in the amount of current, or magnetic field, required to switch states. This increase in current, or magnetic field, can result in a substantial operating power increase, especially in large arrays of GMR cells.

Accordingly, it is highly desirable to provide magnetic random access memories and memory cells with increased GMR ratios and without increasing the magnetic field required for writing and reading.

It is a purpose of the present invention to provide a new and improved magnetic memory cell with increased GMR ratio.

It is another purpose of the present invention to provide a new and improved magnetic memory cell including an increased GMR ratio without changing the amount of magnetic field required for switching states.

It is a purpose of the present invention to provide a new and improved magnetic memory cell with increased GMR ratio with faster speed and low power consumption.

SUMMARY OF THE INVENTION

The above problems and others are at least partially solved and the above purposes and others are realized in first and second layers of magnetic material stacked in parallel, overlying relationship and separated by a first layer of non-magnetic material sandwiched therebetween to form a magnetic memory cell with a second layer of non-magnetic material positioned on an opposite surface of the first layer of magnetic material and a layer of an oxide of a magnetic material (e.g. NiO) positioned on the second layer of non-magnetic material. The second layer of non-magnetic material has a thickness (e.g. approximately 7 Å) which prevents the layer of oxide from pinning the first layer of magnetic material and adapts the first layer of magnetic material to the oxide so as to increase the GMR ratio of the magnetic memory cell.

BRIEF DESCRIPTION OF THE DRAWINGS

Referring to the drawings.

DESCRIPTION OF THE PREFERRED EMBODIMENTS

Figure 1:
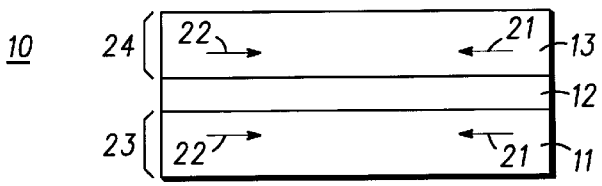
FIG. 1 is a simplified side view of a multi-layer magnetic memory cell utilized for purposes of explanation.

Turning now to the drawings, FIG. 1 illustrates, for purposes of explanation, an enlarged, simplified side view of a magnetic memory cell 10 having multiple layers that are ferromagnetically coupled. Cell 10 includes a first magnetic layer 11 and a second magnetic layer 13, which are separated by a first insulating spacer layer 12. Additionally, layer 11 has a thickness 23 and layer 13 has a thickness 24 that is the same as or less than thickness 23.

Figure 2:
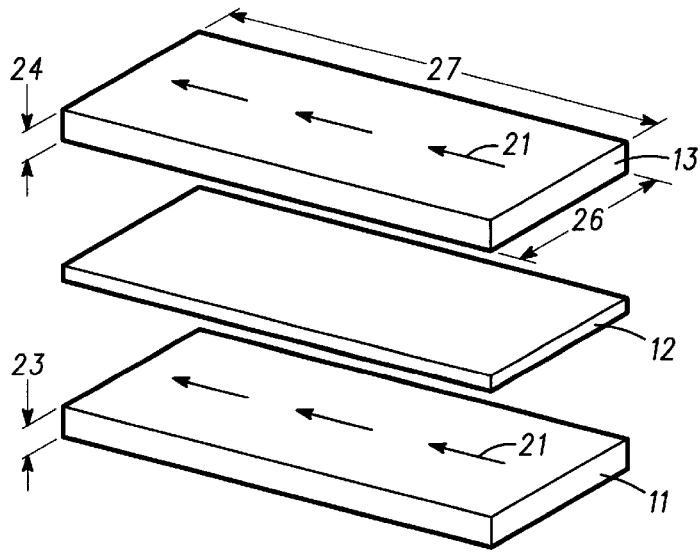
FIG. 2 is a simplified exploded view of the multi-layer magnetic memory cell illustrated in FIG. 1.

Referring to FIG. 2, an enlarged exploded view of cell 10 is illustrated. Portions of FIG. 2 that have the same reference numbers as FIG. 1 are the same as the corresponding FIG. 1 elements. Layers 11 and 13 are generally rectangular and are formed with the easy axis of magnetization along a length 27 and not along a width 26. Layers 11 and 13 each have magnetization vectors 21 that are positioned substantially along length 27, that is, substantially parallel to length 27. Additionally width 26 is formed to be smaller than the width of the magnetic domain walls or transition width within layers 11 and 13. Consequently, vectors 21 can not be parallel to width 26. Typically, widths of less than 1.0 to 1.2 microns result in such a constraint. Width 26 is generally less than one micron and is as small as can be made by manufacturing technology, and length 27 is greater than width 26, generally five times or more.

As illustrated in FIG. 1, vectors 21 and 22 in layers 11 and 13 represent two different states of magnetization within cell 10. It should be understood that these are the same vectors and that they are given different numbers only to indicate different states. One state is referred to as a logic "0" and the other state is a logic "1". While it will be understood by those skilled in the art that any logic definition can be assigned to either state, in this explanation when vector 21 of layer 11 points to the left in FIG. 1, cell 10 is in a logic "0" state and when vector 22 in layer 11 points in the opposite direction cell 10 is in a logic "1" state. Thus, for a first state magnetization the vector in layer 11 points in a first direction and for a second state magnetization the vector in layer 11 point in an opposite direction.

It should be understood by those skilled in the art that the structure of the present invention can be operated with modes other than the ferromagnetic mode, which is utilized herein for purposes of explanation only. Two examples are the antiferromagnetic mode and the spin valve mode. In the antiferromagnetic mode, the resting states of the two magnetic layers 11 and 13 are either clock-wise or anti-clock-wise antiparallel orientations of vectors 21 and 22. These two states can be used as logic "0" and logic "1" states. In the spin valve mode, one of the layers 11 and 13 is normally pinned and the other layer can be switched to be either parallel or antiparallel to the pinned layer. The parallel and antiparallel states of vectors 21 and 22 can be used as logic "0" and logic "1" states.

In this specific example, cell 10 is designed with layer 13 thinner than layer 11 so that a smaller magnetic field will switch the magnetization vectors of layer 13 than is required to switch the magnetization vectors of layer 11. Another way to accomplish this design is to form layer 11 out of magnetic material that requires a higher magnetic field to switch the magnetization vectors.

The provision of electrically conductive non-magnetic layer 12 between ferromagnetic layers 11 and 13 produces an in-plane GMR memory cell which allows a flow of current through the cell. Essentially, cell 10 appears as a relatively high impedance (herein referred to as a resistance R), generally 100 ohms. When the magnetization vectors in layers 11 and 13 are antiparallel the resistance R of cell 10 remains high. When the magnetization vectors in layers 11 and 13 are parallel, the resistance R of cell 10 drops perceptibly. The ratio of the high resistance when the vectors are antiparallel to the low resistance when the vectors are parallel is known as the GMR ratio. The GMR ratio is generally used to sense the state of the cell and the higher the GMR ratio is the easier it is to sense the stored state. It should be understood that a GMR structure with a conductive layer is described herein for purposes of explanation only and the present invention can be used with any of the various types of GMR cells.

Figure 3:
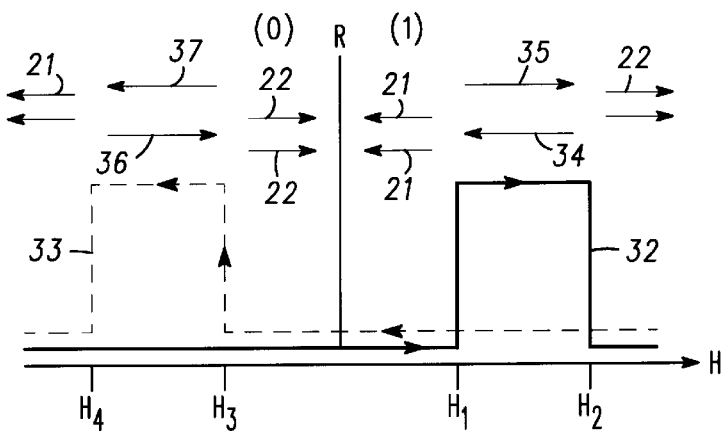
FIG. 3 is a graph illustrating characteristics of the cell of FIG. 1.

Referring specifically to FIG. 3, a graph is illustrated showing the resistance of cell 10 versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 32 indicates the cell resistance which can be achieved for the application of various strengths of a magnetic field in a first direction and curve 33 indicates the cell resistance which can be achieved for the application of various strengths of a magnetic field in a second direction. Vectors 34 and 35 are illustrated with curve 32 and represent the magnetic vectors in layers 11 and 13, respectively, for the application of a magnetic field between values $H_1$ and $H_2$ in the positive direction along the abscissa. Similarly, vectors 36 and 37 are illustrated with curve 33 and represent the magnetic vectors in layers 11 and 13, respectively, for the application of a magnetic field between values $H_3$ and $H_4$ in the negative direction along the abscissa.

Assuming cell 10 is in the state in which vectors 21 both point to the left, moving to the right along the abscissa, the magnetic field increases up to a value $H_1$. Before the value $H_1$ is reached, magnetic vectors 21 are oriented in the same direction, designated a logic "1", and the resistance of cell 10 is low. Upon applying sufficient magnetic field to cell 10, herein designated by the value $H_1$, vector 35 switches to an opposite direction (as shown) and the resistance of cell 10 increases perceptibly. The amount of this increase is equivalent to the GMR ratio. As the magnetic field is increased beyond a value $H_2$ vector 34 also switches to an opposite direction and the resistance of cell 10 again drops to a low value with the magnetic vectors now being represented by vectors 22. Similarly, if the magnetic field is applied in the opposite direction curve 33 applies and magnetic vector 37 of layer 13 switches at a value $H_3$ and the magnetic vector 36 of layer 11 switches at a value $H_4$, with the magnetic vectors now being represented by vectors 21. It should be noted that once the vectors of layers 11 and 13 are set in the orientation depicted by vectors 21 or 22 they will remain in that orientation, even after the applied magnetic field is removed, until a magnetic field sufficiently strong to switch them is applied.

Further, the distance or field strength (operating range) between, $H_1$ and $H_2$, or $H_3$ and $H_4$, is determined by the materials used in cell 10 and the various dimensions of the layers. Generally, cell 10 is designed to provide a wide operating range. Thus, in this example and assuming that the magnetization vectors of layer 11 are set in the orientation indicated by curve 32 (vector 34) the cell can be set to a logic "0" (parallel magnetization vectors pointing right in FIG. 3) by applying a field with a strength greater than $H_2$, e.g. 50 Oersteds. Also, the cell can be set to a logic "1" (parallel magnetization vectors pointing left in FIG. 3) by applying a magnetic field greater than $H_4$, e.g. −50 Oersteds.

The following procedure can be used to read stored states in magnetic memory cell 10. Assuming that the vectors of layers 11 and 13 are set in the orientation indicated by curve 33 (vectors 22), applying a positive magnetic field to cell 10 (either $H_1$ or $H_2$) has no effect, which is an indication that the cell has a logic "0" stored therein. Conversely, applying a negative magnetic field to cell 10 between the values $H_4$ and $H_3$, will cause the magnetic vector in layer 13 to switch (vectors 36 and 37) to an antiparallel position and the substantial change in resistance of the cell (generally equivalent to the GMR ratio) can be detected as described above.

In a similar fashion, when vectors of layers 11 and 13 are set in the orientation indicated by curve 32 (vectors 21), applying a negative magnetic field to cell 10 (either $H_3$ or $H_4$) has no effect indicating that the cell has a logic "1" stored therein. Conversely, applying a positive magnetic field to cell 10 between the values $H_1$ and $H_2$, will cause the magnetic vector in layer 13 to switch (vectors 34 and 35) to an antiparallel position and the substantial change in resistance of the cell is easily detected.

Figure 4:
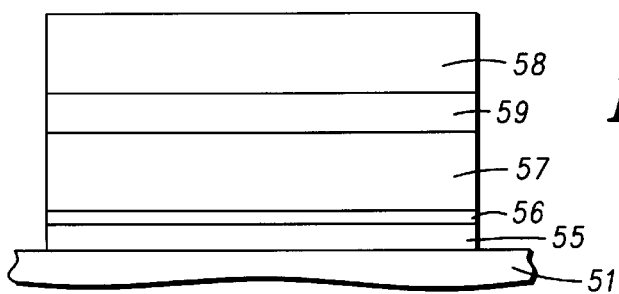
FIG. 4 is a simplified side view of a magnetic memory cell with increased GMR ratio in accordance with the present invention.

Referring now to FIG. 4, a simplified side view of a magnetic memory cell 50 with increased GMR ratio in accordance with the present invention is illustrated. Cell 50 is formed on a supporting substrate 51, which may be formed of any convenient material, such as silicon or the like, that allows additional semiconductor process steps and the use of semiconductor techniques in the fabrication. A layer 55 of an oxide of a magnetic material is formed on a surface of supporting substrate 51 by any convenient technique. Layer 55 may be, for example, one of NiO, $FeO_x$, CoO, $Ni_xFe_yO$, $Ni_xCo_yO$, $Co_xFe_yO$, and $Ni_xFe_yCo_zO$, and in a preferred embodiment is NiO. Also, layer 55 will generally be formed with a thickness greater than 150 Å and with a preferred range of approximately 300 Å to 500 Å.

A thin layer 56 of non-magnetic material is formed on layer 55 by any convenient technique. Generally, layer 56 is formed with a thickness greater than approximately 5 Å, and preferably approximately 7 Å, and includes, for example copper, tantalum, etc.

First and second layers 57 and 58, respectively, of magnetic material are stacked in parallel, overlying relationship on layer 56 and separated by a layer 59 of non-magnetic material sandwiched between first and second layers 57 and 58 so as to form magnetic memory cell 50 with a usual length and a usual width. Generally, as described above, the width of magnetic memory cell 50 is less than a width of magnetic domain walls within layers 57 and 58 so that magnetic vectors in layers 57 and 58 point substantially along a length thereof. Although shown having two magnetic layers in this embodiment, cell 50 can have more than two magnetic layers in some special applications.

Magnetic layers 57 and 58 each can be single layers of ferromagnetic materials such as a layer of nickel, iron, cobalt, or alloys thereof including alloys having palladium or platinum therein. Alternatively, either of layers 57 and 58 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 59 include most conductive and non-conductive materials such as copper, oxides, nitrides, dielectrics, etc.

In a specific example, layer 57 is formed of cobalt (Co) approximately 60 Å thick, layer 59 is formed of copper (Cu) approximately 20 Å thick, and layer 58 is formed of cobalt approximately 40 Å thick. Thus, the state of cell 50 is sensed by passing a sense current therethrough and applying a specific magnetic field to cell 50. Any change of resistance in cell 50 is read as a change in voltage drop across cell 50 which can conveniently be used in conjunction with memory arrays and the like.

In the literature, *Journal of Applied Physics*, Vol. 79, No. 8, page 5277, April 1996, spin valves were fabricated on thick NiO substrates (greater than 30 nm) to improve the GMR ratio. In these structures the NiO is used as a magnetic pinning layer, which has advantages in the specific application for which these structures were being used. However, in MRAM applications the pinning field is undesirable because it increases the cell switching field, causing higher power consumption.

In cell 50 of FIG. 4, for example, thin layer 56 of non-magnetic material sandwiched between layer 55 of an oxide of a magnetic material and cell 50 prevents oxide layer 55 from pinning first layer 57 of magnetic material and adapts first and second layers 57 and 58 of magnetic material to oxide layer 55 so as to increase the GMR ratio of the magnetic memory cell. It has been found that non-magnetic layer 56 can be formed as thin as approximately 7 Å and it will still prevent the formation of a pinning field. Further, it is expected that even thinner oxide layers might be utilized to reduce the pinning field in some applications. Thus, cell 50 has the highest possible GMR ratio while still maintaining a low switching field. The low switching field results in less power consumption and the high GMR ratio allows faster reading speed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A magnetic memory cell with increased GMR ratio comprising:

a layer of an oxide of a magnetic material;

a first layer of non-magnetic material positioned on a major surface of the layer of an oxide;

first and second layers of magnetic material stacked in parallel, overlying relationship and separated by a second layer of non-magnetic material sandwiched therebetween so as to form a magnetic memory cell, the first layer of magnetic material having a first major surface adjacent the second layer of non-magnetic material and an opposite major surface positioned on the first layer of non-magnetic material so that the first layer of non-magnetic material is sandwiched between the first layer of magnetic material and the layer of an oxide; and the first layer of non-magnetic material having a thickness which prevents the layer of an oxide from pinning the first layer of magnetic material and adapts the first layer of magnetic material to the layer of an oxide so as to increase the GMR ratio of the magnetic memory cell.

2. A magnetic memory cell with increased GMR ratio as claimed in claim 1 wherein the thickness of the first layer of non-magnetic material is greater than approximately 5 Å.

3. A magnetic memory cell with increased GMR ratio as claimed in claim 2 wherein the thickness of the first layer of non-magnetic material is approximately 7 Å.

4. A magnetic memory cell with increased GMR ratio as claimed in claim 1 wherein the first layer of non-magnetic material includes one of copper or tantalum.

5. A magnetic memory cell with increased GMR ratio as claimed in claim 1 wherein the layer of an oxide of a magnetic material includes one of NiO, $FeO_x$, CoO, $Ni_xFe_yO$, $Ni_xCo_yO$, $Co_xFe_yO$, and $Ni_xFe_yCo_zO$.

6. A magnetic memory cell with increased GMR ratio as claimed in claim 5 wherein the layer of an oxide of a magnetic material includes NiO.

7. A magnetic memory cell with increased GMR ratio comprising:

a layer of an oxide of a magnetic material;

a thin layer of non-magnetic material with a thickness greater than approximately 5 Å formed on the layer of an oxide; and first and second layers of magnetic material stacked in parallel, overlying relationship on the thin layer of non-magnetic material and separated by a layer of non-magnetic material sandwiched between the first and second layers of magnetic material so as to form a magnetic memory cell;

the thin layer of non-magnetic material having a thickness which prevents the layer of an oxide from pinning the first layer of magnetic material and adapts the first and second layers of magnetic material to the layer of an oxide so as to increase the GMR ratio of the magnetic memory cell.

8. A magnetic memory cell with increased GMR ratio as claimed in claim 7 wherein the thickness of the thin layer of non-magnetic material is approximately 7 Å.

9. A magnetic memory cell with increased GMR ratio as claimed in claim 7 wherein the thin layer of non-magnetic material includes one of copper or tantalum.

10. A magnetic memory cell with increased GMR ratio as claimed in claim 7 wherein the layer of an oxide of a magnetic material includes one of NiO, $FeO_x$, CoO, $Ni_xFe_yO$, $Ni_xCo_yO$, $Co_xFe_yO$, and $Ni_xFe_yCo_zO$.

11. A magnetic memory cell with increased GMR ratio as claimed in claim 10 wherein the layer of an oxide of a magnetic material includes NiO.

12. A magnetic memory cell with increased GMR ratio comprising:

a supporting substrate;

a layer of an oxide of a magnetic material formed on a surface of the supporting substrate;

a thin layer of non-magnetic material with a thickness greater than approximately 5 Å formed on the layer of an oxide;

first and second layers of magnetic material stacked in parallel, overlying relationship on the thin layer of non-magnetic material and separated by a layer of non-magnetic material sandwiched between the first and second layers of magnetic material so as to form a magnetic memory cell having a length and a width;

the width of the multi-layer magnetic memory cell being less than a width of magnetic domain walls within the layers of magnetic material wherein magnetic vectors in the layers of magnetic material point substantially along a length of the layers of magnetic material; and the thin layer of non-magnetic material having a thickness which prevents the layer of an oxide from pinning the first layer of magnetic material and adapts the first and second layers of magnetic material to the layer of an oxide so as to increase the GMR ratio of the magnetic memory cell.

13. A magnetic memory cell with increased GMR ratio as claimed in claim 12 wherein the thickness of the thin layer of non-magnetic material is approximately 7 Å.

14. A magnetic memory cell with increased GMR ratio as claimed in claim 12 wherein the thin layer of non-magnetic material includes one of copper or tantalum.

15. A magnetic memory cell with increased GMR ratio as claimed in claim 12 wherein the layer of an oxide of a magnetic material includes one of NiO, $FeO_x$, CoO, $Ni_xFe_yO$, $Ni_xCo_yO$, $Co_xFe_yO$, and $Ni_xFe_yCo_zO$.

16. A magnetic memory cell with increased GMR ratio as claimed in claim 15 wherein the layer of an oxide of a magnetic material includes NiO.

17. A magnetic memory cell with increased GMR ratio as claimed in claim 12 wherein the non-magnetic material sandwiched between the first and second layers of magnetic material includes one of an electrically conductive material and an electrically insulating material.

* * * * *

UNITED STATES PATENT AND TRADEMARK OFFICE
CERTIFICATE OF CORRECTION

PATENT NO.    : 5,774,394                                        Page 1 of 1
DATED         : June 30, 1998
INVENTOR(S)   : Chen et al.

It is certified that error appears in the above-identified patent and that said Letters Patent is hereby corrected as shown below:

<u>Column 1,</u>
Line 3, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*